(12) United States Patent
Pan et al.

(10) Patent No.: US 12,527,053 B2
(45) Date of Patent: Jan. 13, 2026

(54) SEMICONDUCTOR STRUCTURE AND METHOD OF FORMING THE SAME

(71) Applicant: Shanghai Huahong Grace Semiconductor Manufacturing Corporation, Shanghai (CN)

(72) Inventors: Jia Pan, Shanghai (CN); Peng Sun, Shanghai (CN); Yiping Yao, Shanghai (CN); Jiye Yang, Shanghai (CN); Junjun Xing, Shanghai (CN); Chong Chen, Shanghai (CN); Xuan Huang, Shanghai (CN); Tongbo Zhang, Shanghai (CN)

(73) Assignee: SHANGHAI HUAHONG GRACE SEMICONDUCTOR MANUFACTURING CORPORATION, Shanghai (CN)

( * ) Notice: Subject to any disclaimer, the term of this patent is extended or adjusted under 35 U.S.C. 154(b) by 537 days.

(21) Appl. No.: 17/886,321

(22) Filed: Aug. 11, 2022

(65) Prior Publication Data

US 2023/0112037 A1    Apr. 13, 2023

(30) Foreign Application Priority Data

Oct. 11, 2021  (CN) .......................... 202111183105.1

(51) Int. Cl.
*H10D 62/17*     (2025.01)
*H01L 21/265*    (2006.01)
*H10D 12/00*     (2025.01)

(52) U.S. Cl.
CPC ..... *H10D 62/393* (2025.01); *H01L 21/26513* (2013.01); *H10D 12/481* (2025.01)

(58) Field of Classification Search
CPC .... H10D 12/01; H10D 12/038; H10D 12/411; H10D 62/054; H10D 62/058; H10D 62/102; H10D 62/111; H10D 62/393
(Continued)

(56) References Cited

U.S. PATENT DOCUMENTS

2015/0287786 A1*  10/2015  Jeon .................. H01L 29/66348
                                                   438/138
2016/0352326 A1   12/2016  Laven et al.
(Continued)

FOREIGN PATENT DOCUMENTS

CN      101246904 A      8/2008
CN      106206701 A     12/2016
(Continued)

OTHER PUBLICATIONS

First Chinese Office Action regarding Chinese Application No. 202111183105.1, dated May 28, 2023.

*Primary Examiner* — Fazli Erdem
(74) *Attorney, Agent, or Firm* — Harness, Dickey & Pierce, P.L.C.

(57) ABSTRACT

The present disclosure provides a semiconductor structure and a method of forming the same. The semiconductor structure includes: a substrate doped with a first ion, a deep trench structure disposed in the substrate, a barrier doped region disposed on a top of the substrate and the deep trench structure, a first epitaxial layer disposed on the barrier doped region, a body region disposed in the first epitaxial layer, a source region disposed in the body region, a gate structure disposed in the first epitaxial layer, and a collector region disposed at a bottom of the substrate. By means of the semiconductor structure, performance of an insulated gate bipolar transistor can be improved.

17 Claims, 7 Drawing Sheets

(58) Field of Classification Search
USPC .......................................................... 257/329
See application file for complete search history.

(56) References Cited

U.S. PATENT DOCUMENTS

| | | | |
|---|---|---|---|
| 2017/0179279 A1 | 6/2017 | Lin et al. | |
| 2019/0198607 A1 | 6/2019 | Hamada et al. | |
| 2020/0219996 A1* | 7/2020 | Yang | H01L 29/0646 |

FOREIGN PATENT DOCUMENTS

| | | |
|---|---|---|
| CN | 208819886 U | 5/2019 |
| CN | 109888005 A | 6/2019 |
| JP | 2017054934 A | 3/2017 |

* cited by examiner

SEMICONDUCTOR STRUCTURE AND METHOD OF FORMING THE SAME

CROSS-REFERENCE TO RELATED APPLICATIONS

The present application claims the benefit of priority to Chinese patent application No. 202111183105.1, filed on Oct. 11, 2021, entitled "Semiconductor Structure And Method Of Forming The Same", the entire disclosures of which are incorporated herein by reference.

TECHNICAL FIELD

The present disclosure relates to the field of semiconductor technology, and more particularly to a semiconductor structure and a method of forming the same.

BACKGROUND

In medium and high-power switching power supply device, Insulated Gate Bipolar Transistor (IGBT) has been widely used in modern power electronics technology due to its simple control and drive circuit, high operating frequency and large capacity.

The insulated gate bipolar transistor is a compound device composed of a MOSFET and a bipolar transistor, wherein the MOSFET works as an input electrode, and a PNP transistor works as an output electrode. The insulated gate bipolar transistor can be regarded as a Darlington transistor with a MOS as an input. The insulated gate bipolar transistor combines advantages of high input impedance and simple and fast drive of MOSFET, and low conduction voltage drop and large capacity of bipolar device.

However, the performance of current insulated gate bipolar transistor needs to be improved.

SUMMARY

Embodiments of the present disclosure provide a semiconductor structure and a method of forming the same so as to improve the performance of an insulated gate bipolar transistor.

An embodiment of the present disclosure provides a semiconductor structure, including: a substrate doped with a first ion, wherein the substrate has a first surface and a second surface opposite to each other; a deep trench structure disposed in the substrate, wherein the first surface exposes a top surface of the deep trench structure, and the deep trench structure is doped with a second ion having a conductivity type opposite to a conductivity type of the first ion; a barrier doped region disposed on a top of the substrate and the deep trench structure, wherein the barrier doped region is doped with a third ion having a conductivity type same as the conductivity type of the first ion, and a doping concentration of the third ion is greater than a doping concentration of the first ion; a first epitaxial layer disposed on the barrier doped region, wherein the first epitaxial layer is doped with a fourth ion having a conductivity type same as the conductivity type of the third ion, and the doping concentration of the third ion is greater than a doping concentration of the fourth ion; a body region disposed in the first epitaxial layer, wherein the body region is disposed above the barrier doped region, and at least a part of the body region is disposed above the deep trench structure; a source region disposed in the body region, wherein the body region exposes a partial surface of the source region; a gate structure disposed in the first epitaxial layer, wherein the gate structure is disposed above the barrier doped region, the gate structure is also disposed above the substrate adjacent to the deep trench structure, and the gate structure is in contact with the body region and the exposed partial surface of the source region; and a collector region disposed at a bottom of the substrate, wherein the second surface exposes a surface of the collector region, and the collector region is spaced from a bottom of the deep trench structure by the substrate.

In some embodiments, the barrier doped region has a depth ranging from 0.1 micron to 10 microns in a direction perpendicular to the first surface.

In some embodiments, the first ion, the third ion and the fourth ion are N-type and the second ion is P-type.

In some embodiments, the third ion is phosphorus ion, and the doping concentration of the third ion doped in the barrier doped region ranges from 1E15 atoms per cubic centimeter to 1E18 atoms per cubic centimeter.

In some embodiments, the collector region is doped with a fifth ion, the fifth ion is P-type and a doping concentration of the fifth ion is greater than a doping concentration of the second ion.

In some embodiments, the doping concentration of the fourth ion is greater than the doping concentration of the first ion.

In some embodiments, the doping concentration of the fourth ion doped in the first epitaxial layer ranges from 1E15 atoms per cubic centimeter to 1E18 atoms per cubic centimeter.

In some embodiments, the doping concentration of the first ion doped in the substrate ranges from 1E15 atoms per cubic centimeter to 1E18 atoms per cubic centimeter.

In some embodiments, the body region is doped with a P-type ion and the source region is doped with a N-type ion.

In some embodiments, the gate structure includes a gate electrode and a gate dielectric layer disposed between the gate electrode and the first epitaxial layer, and the gate dielectric layer is also disposed between the gate electrode and surfaces of the body region and the source region.

In some embodiments, a surface of the first epitaxial layer exposes surfaces of the gate structure, the body region and the source region, and the semiconductor structure further includes: an interlayer dielectric layer disposed on the surface of the first epitaxial layer and exposed surfaces of the gate structure, the body region and the source region, a first conductive structure disposed in the interlayer dielectric layer and coupled to the gate structure, and a second conductive structure disposed in the interlayer dielectric layer and coupled to the body region and the source region.

In some embodiments, the semiconductor structure further includes: a third conductive structure electrically coupled to the collector region.

Another embodiment of the present disclosure provides a method of forming a semiconductor structure, including: providing a substrate doped with a first ion, wherein the substrate has a first surface and a second surface opposite to each other; forming a deep trench structure in the substrate, wherein the first surface exposes a top surface of the deep trench structure, and the deep trench structure is doped with a second ion having a conductivity type opposite to a conductivity type of the first ion; forming a barrier doped region on a top of the substrate and the deep trench structure, wherein the barrier doped region is doped with a third ion having a conductivity type same as the conductivity type of the first ion, and a doping concentration of the third ion is greater than a doping concentration of the first ion; forming a first epitaxial layer on the barrier doped region, wherein the first epitaxial layer is doped with a fourth ion having a conductivity type same as the conductivity type of the third ion, and the doping concentration of the third ion is greater than a doping concentration of the fourth ion; forming a body region, a source region and a gate structure in the first epitaxial layer, wherein the body region is disposed above the barrier doped region, and at least part of the body region is disposed above the deep trench structure, wherein the body region exposes a partial surface of the source region, and wherein the gate structure is disposed above the barrier doped region, the gate structure is also disposed above the substrate adjacent to the deep trench structure, and the gate structure is in contact with the body region and the exposed partial surface of the source region; and forming a collector region at a bottom of the substrate after forming the body region, source region and gate structure, wherein the second surface exposes a surface of the collector region, and the collector region is spaced from a bottom of the deep trench structure by the substrate.

In some embodiments, the first ion, the third ion and the fourth ion are N-type and the second ion is P-type.

In some embodiments, forming the barrier doped region on the top of the substrate and the deep trench structure includes: performing ion implantation on the first surface and the top surface of the deep trench structure.

In some embodiments, process parameters for performing ion implantation on the first surface and the top surface of the deep trench structure are as follows: implanted ion includes phosphorus ion, implantation dose ranges from 1E11 atoms per square centimeter to 1E14 atoms per square centimeter, and implantation energy ranges from 1 MeV to 3 MeV.

In some embodiments, forming the deep trench structure in the substrate includes: etching the substrate to form a deep trench in the substrate, wherein the first surface exposes the deep trench; and forming the deep trench structure in the deep trench by an epitaxial growth process.

Compared with conventional technology, embodiments of the present disclosure have following beneficial effects:

In the semiconductor structure according to the embodiments of the present disclosure, in one aspect, the barrier doped region is disposed on the top of the substrate and the deep trench structure, the first epitaxial layer is disposed on the barrier doped region, the body region and the gate structure are disposed in the first epitaxial layer, the source region is disposed in the body region, and both the body region and the gate structure are disposed above than the barrier doped region (namely, the barrier doped region is spaced apart from the body region, the source region and the gate structure by a part of the first epitaxial layer), in another aspect, the doping concentration of the third ion is greater than that of the fourth ion and the first ion. Therefore, carriers (injected from the collector region) entering the body region through the deep trench structure can be blocked by the barrier doped region at a certain distance from the body region, which means that the carriers entering the body region can be reduced. In doing so, the carriers injected from the collector region can be better collected in a drift region below the body region and the gate structure (i.e., the first epitaxial layer, the barrier doped region and the substrate below the body region and the gate structure), and a concentration of the carriers of the drift region can be increased. Thus, not only an on-resistance of the drift region can be reduced to reduce an on-state voltage drop of the insulated gate bipolar transistor, but also a turn-off energy loss (EOFF) of the insulated gate bipolar transistor can be improved. Furthermore, the performance of the insulated gate bipolar transistor can be improved.

DETAILED DESCRIPTION

As described in the background, the performance of current insulated gate bipolar transistor needs to be improved.

Figure 1:
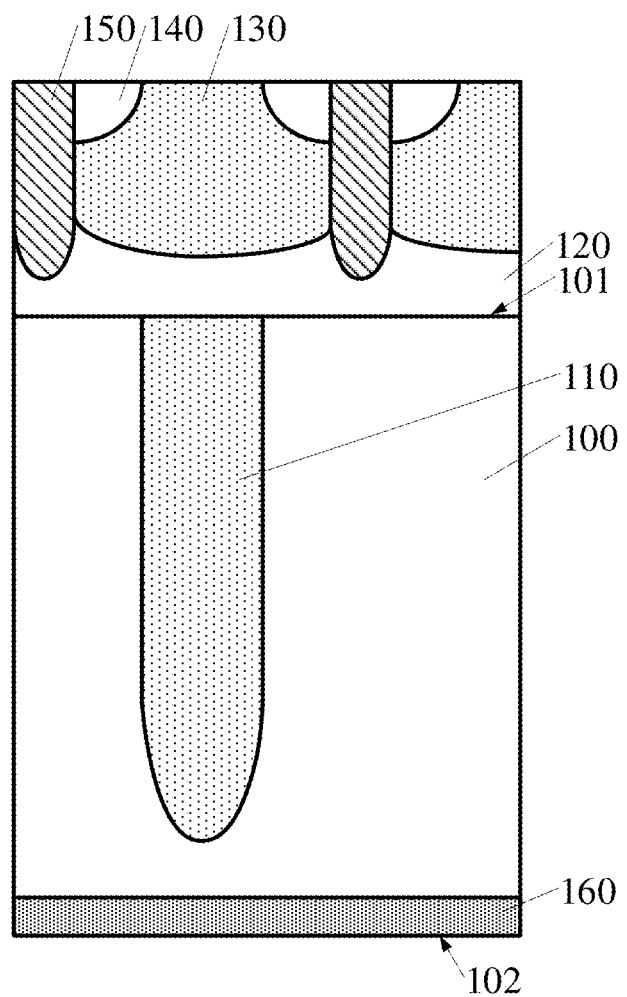
FIG. 1 is a structural schematic view of an insulated gate bipolar transistor.

FIG. 1 is a structural schematic view of an insulated gate bipolar transistor.

With reference to FIG. 1, the insulated gate bipolar transistor incudes: an N-type substrate 100, a P-type column structure 110, an N-type epitaxial layer 120, a P-type body region 130, an N-type source region 140, a gate structure 150 and a P-type collector region 160. The N-type substrate 100 has a top surface 101 and a bottom surface 102 opposite to each other. The P-type column structure 110 is disposed in the N-type substrate 100, and the top surface 101 exposes a surface of the P-type column structure 110. The N-type substrate 100 and the P-type column structure 110 constitute a super junction structure so as to improve a withstand voltage of the insulated gate bipolar transistor when the insulated gate bipolar transistor is turned off. The N-type epitaxial layer 120 is disposed on the top surface 101 and the surface of the P-type column structure 110. The P-type body region 130 is disposed in the N-type epitaxial layer 120. The N-type source region 140 is disposed in the P-type body region 130. The gate structure 150 is disposed in the N-type epitaxial layer 120. The gate structure 150 is in contact with a surface of the P-type body region 130 and a surface of the N-type source region 140. The P-type collector region 160 is disposed in the N-type substrate 100, and the bottom surface 102 constitutes a surface of the collector region 160.

However, in the above-mentioned structure, when a signal is applied to the gate structure 150 to turn on the insulated gate bipolar transistor, the blocking ability of the N-type epitaxial layer 120 is weak, and holes injected in the collector region 160 may easily enter the P-type body region 130 through the P-type column structure 110, which results in a lower hole concentration in a drift region (the N-type substrate 100 and the N-type epitaxial layer 120). Therefore, an on-resistance of the drift region is high, which results in a high on-state voltage drop of the insulated gate bipolar transistor. Moreover, a turn-off energy loss of the insulated gate bipolar transistor is large. Thus, the performance of the insulated gate bipolar transistor is poor.

In order to solve the above-mentioned technical problem, the technical solution of the present disclosure provides a semiconductor structure and a method of forming the same. With the barrier doped region disposed on the top of the substrate and the deep trench structure, the on-resistance of the drift region can be reduced and the on-state voltage drop of the insulated gate bipolar transistor can be reduced. Moreover, the turn-off energy loss (EOFF) of the insulated gate bipolar transistor can be improved. Thus, the performance of the insulated gate bipolar transistor can be improved.

In order to make above objects, features and beneficial effects of the present disclosure more obvious and understandable, specific embodiments of the present disclosure are described in detail below in combination with the accompanying drawings.

FIGS. 2-8 are cross-sectional views corresponding to various steps in the method of forming the semiconductor structure according to an embodiment of the present disclosure.

Figure 2:
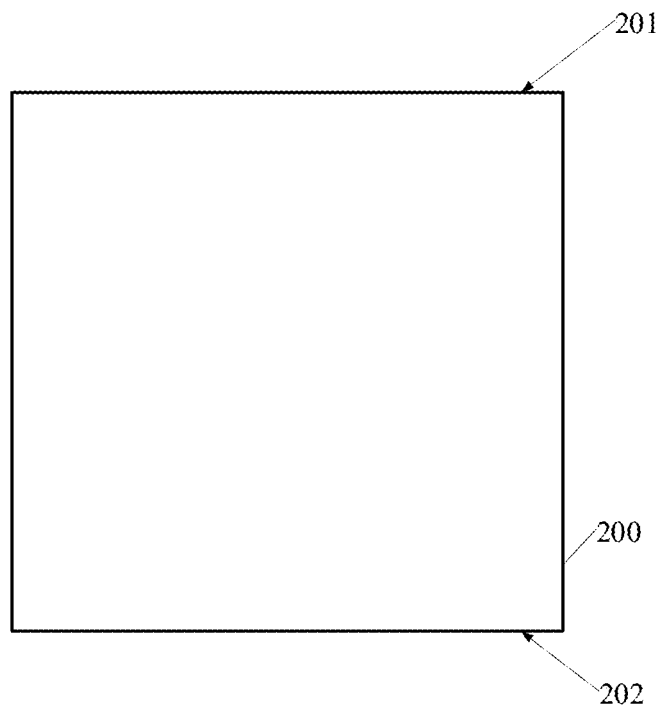
FIGS. 2-8 are cross-sectional views corresponding to various steps in a method of forming a semiconductor structure according to an embodiment of the present disclosure.

Referring to FIG. 2, a substrate 200 doped with a first ion is provided, and the substrate 200 has a first surface 201 and a second surface 202 opposite to each other.

In some embodiments, the material of the substrate 200 includes semiconductor material. Specifically, the material of the substrate 200 includes silicon.

In some embodiments, the material of the substrate includes silicon carbide, silicon germanium, multicomponent semiconductor material composed of III-V elements, Silicon On Insulator (SOI) or Germanium On Insulator (GOI), etc. The multicomponent semiconductor material composed of III-V elements includes InP, GaAs, GaP, InAs, InSb, InGaAs or InGaAsP, etc.

In some embodiments, the first ion is an N-type ion, that is, the substrate 200 is an N-type substrate.

Specifically, the N-type ion includes phosphorous ion or arsenic ion.

In some embodiments, the first ion may also be a P-type ion to form a device structure having a conductivity type diametrically opposite to that of above embodiments.

In some embodiments, a doping concentration of the first ion doped in the substrate 200 ranges from 1E15 atoms per cubic centimeter to 1E18 atoms per cubic centimeter.

Figure 3:
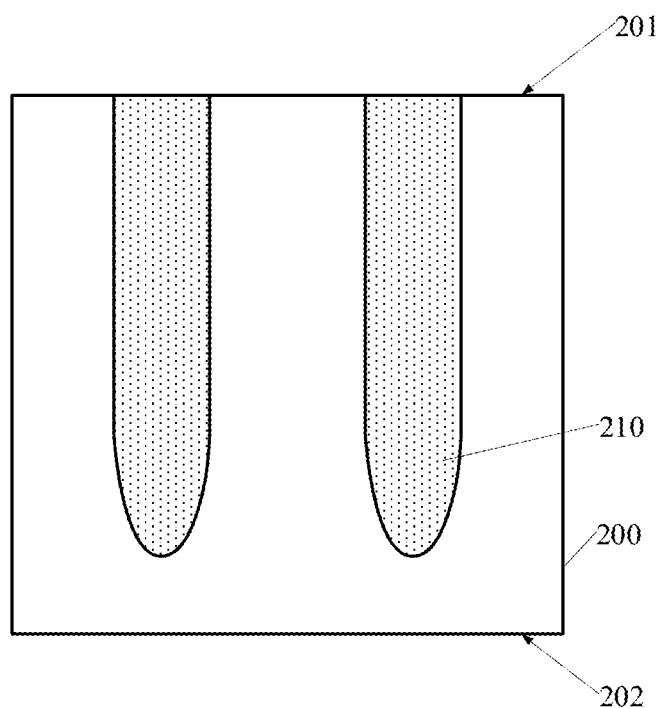

Referring to FIG. 3, a deep trench structure 210 is formed in the substrate 200, and a top surface of the deep trench structure 210 is exposed by the first surface 201. The deep trench structure 210 is doped with a second ion, and the conductivity type of the second ion is opposite to that of the first ion.

Since the conductivity types of the second ion and the first ion are opposite, a super junction structure is formed between the deep trench structure 210 and the substrate 200 around the deep trench structure 210, so that an insulated gate bipolar transistor (hereinafter referred to as an IGBT device) formed by the substrate 200 and the deep trench structure 210 can have a higher withstand voltage performance when being turned off.

In some embodiments, the second ion is a P-type ion.

Specifically, the P-type ion includes boron ion or indium ion.

In some embodiments, the method of forming the deep trench structure 210 includes: forming a first mask layer (not shown) on the first surface 201, wherein a part of the first surface 201 is exposed by the first mask layer; etching the substrate 200 with the first mask layer as a mask to form a deep trench (not shown) in the substrate 200, wherein the deep trench is exposed by the first surface 201, and in a direction perpendicular to the first surface 201, the depth of the deep trench is less than the thickness of the substrate 200; and forming the deep trench structure 210 in the deep trench.

In some embodiments, the process of forming the deep trench structure 210 in the deep trench includes an epitaxial growth process or the like.

In some embodiments, the first masking layer is removed after forming the deep trench structure 210.

Figure 4:
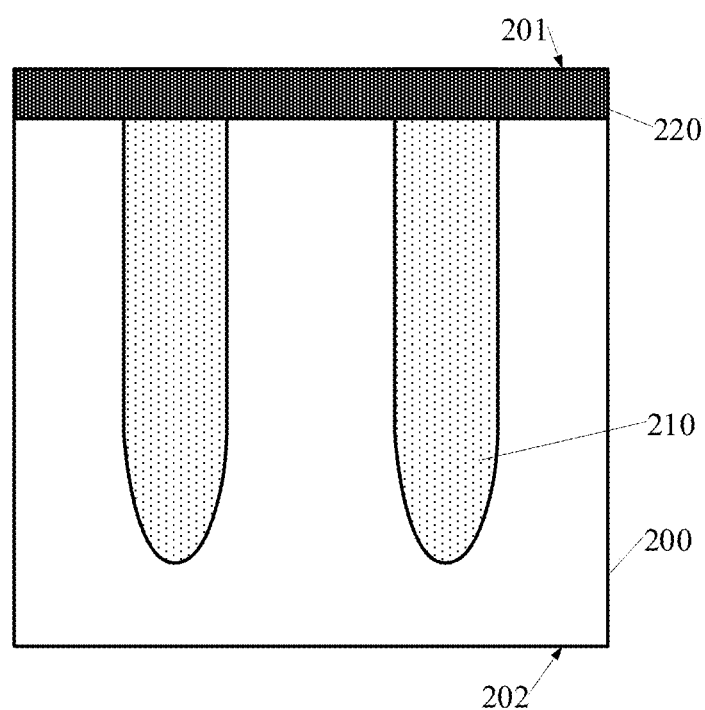

Referring to FIG. 4, a barrier doped region 220 is formed on the top of the substrate 200 and the deep trench structure 210.

The barrier doped region 210 is doped with a third ion. The third ion has the same conductivity type as that of the first ion, and a doping concentration of the third ion is greater than that of the first ion in the substrate 200.

The purpose of forming the barrier doped region 220 is to block the carriers injected from subsequently formed collector region by the barrier doped region 220 having a opposite type to the deep trench structure 210 and having a greater doping concentration of the third ion, so as to reduce the carriers entering subsequently formed body region through the deep trench structure 210.

In some embodiments, the third ion is an N-type ion. Accordingly, the carriers blocked by the barrier doped region 220 are holes injected from the collector region.

Specifically, the third ion is phosphorus ion.

In some embodiments, the doping concentration of the third ion in the barrier doped region 220 ranges from 1E15 atoms per cubic centimeter to 1E18 atoms per cubic centimeter.

If the doping concentration of the third ion in the barrier doped region 220 is too low, blocking ability for carriers will be weak, and thus better blocking for carriers cannot be achieved. Therefore, with an appropriate doping concentration, that is, the doping concentration of the third ion in the barrier doped region 220 ranges from 1E15 atoms per cubic centimeter to 1E18 atoms per cubic centimeter, the barrier doped region 220 can have better blocking ability for carriers entering the body region, so as to better improve the performance of the IGBT device.

In some embodiments, in the direction perpendicular to the first surface 201, the depth of the barrier doped region 220 ranges from 0.1 micron to 10 microns.

If the depth of the barrier doped region 220 is too small, blocking capability for carriers is weak, and thus better blocking for carriers cannot be achieved. If the depth of the barrier doped region 220 is too large, on the one hand, the efficiency of the manufacturing process may be reduced, on the other hand, the super junction structure may be affected, which adversely affects the withstand voltage performance of the IGBT device. Therefore, with a suitable depth range of the barrier doped region 220 (0.1 micron to 10 microns), a better voltage withstand performance of the IGBT device can be achieved, while having a better blocking capability for the carriers. Furthermore, the efficiency of the manufacturing process can be increased.

In some embodiments, forming the barrier doped region 220 on the top of the substrate 200 and the deep trench structure 210 includes: performing ion implantation on the first surface 201 and the top surface of the deep trench structure 210.

Forming the barrier doped region 220 by an ion implantation process can reduce the process difficulty of forming the barrier doped region 220 compared to forming an ion doping structure having a higher concentration by an epitaxial growth process.

In some embodiments, process parameters for performing ion implantation on the first surface 201 and the top surface of the deep trench structure 210 includes: implanted ions include phosphorus ions, implantation dose ranges from 1E11 atoms per square centimeter to 1E14 atoms per square centimeter, and implantation energy is between 1 MeV and 3 MeV.

By employing an implantation dose and an implantation energy in the ranges described above, the formation of the barrier doped region 220 can be achieved such that the concentration of the third ion doped in the barrier doped region 220 ranges from 1E15 atoms per cubic centimeter to 1E18 atoms per cubic centimeter and such that the depth of the barrier doped region 220 in the direction perpendicular to the first surface 201 ranges from 0.1 micron to 10 microns.

Figure 5:
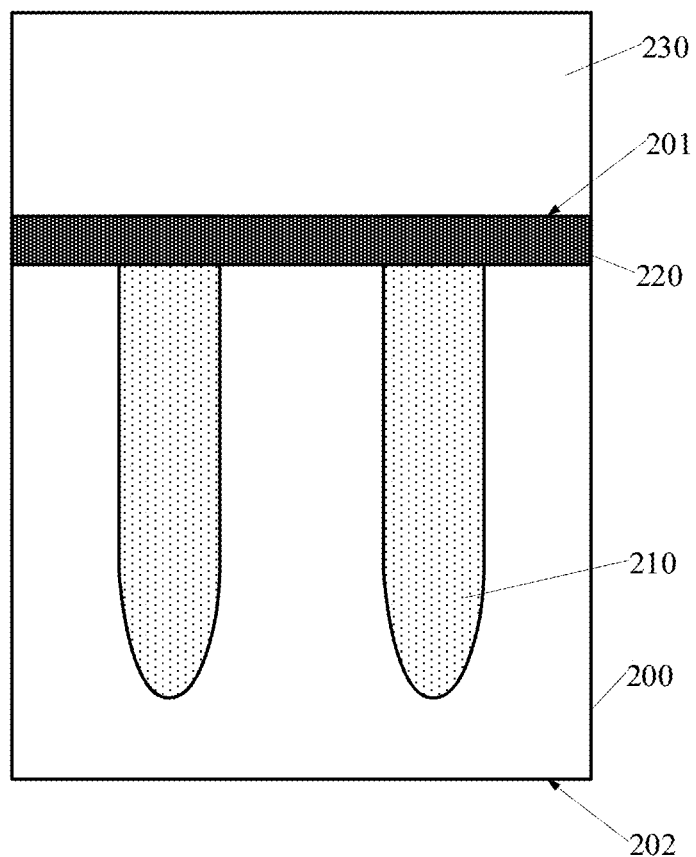

Referring to FIG. 5, a first epitaxial layer 230 is formed on the barrier doped region 220 by an epitaxial growth process.

The first epitaxial layer 230 is doped with a fourth ion, and the fourth ion has the same conductivity type as that of the third ion.

In some embodiments, the substrate 200, the barrier doped region 220 and the first epitaxial layer 230 constitute a drift region.

In particular, the doping concentration of the third ion is greater than the doping concentration of the fourth ion.

In some embodiments, the doping concentration of the fourth ion in the first epitaxial layer 230 is greater than the doping concentration of the first ion in the substrate 200.

Since the conductivity types of the fourth ion and the third ion are the same, and the subsequently formed body region and the deep trench structure 220 are spaced apart by a part of the first epitaxial layer 230, the blocking ability for carriers entering the body region can be further increased by making the doping concentration of the fourth ion in the first epitaxial layer 230 greater than the doping concentration of the first ion in the substrate 200 based on the first epitaxial layer 230 on the basis of the barrier doped region 220.

In some embodiments, the doping concentration of the fourth ion in the first epitaxial layer is in the range of 1E15 atoms per cubic centimeter to 1E18 atoms per cubic centimeter.

On the one hand, too high doping concentration of the fourth ion is detrimental to the withstand voltage performance of the IGBT device, and on the other hand, too high doping concentration greatly increases the difficulty of the epitaxial growth process.

Therefore, by adopting appropriate doping concentration of the fourth ion, when the doping concentration of the fourth ion in the first epitaxial layer is in the range of 1E15 atoms per cubic centimeter to 1E18 atoms per cubic centimeter on the basis that the doping concentration of the fourth ion in the first epitaxial layer 230 is greater than that of the first ion in the substrate 200, a better voltage withstand performance of the IGBT device can be obtained and the difficulty of the epitaxial growth process can be reduced, while the blocking ability for carriers entering the body region can be further increased.

In some embodiments, the fourth ion is an N-type ion.

Figure 6:
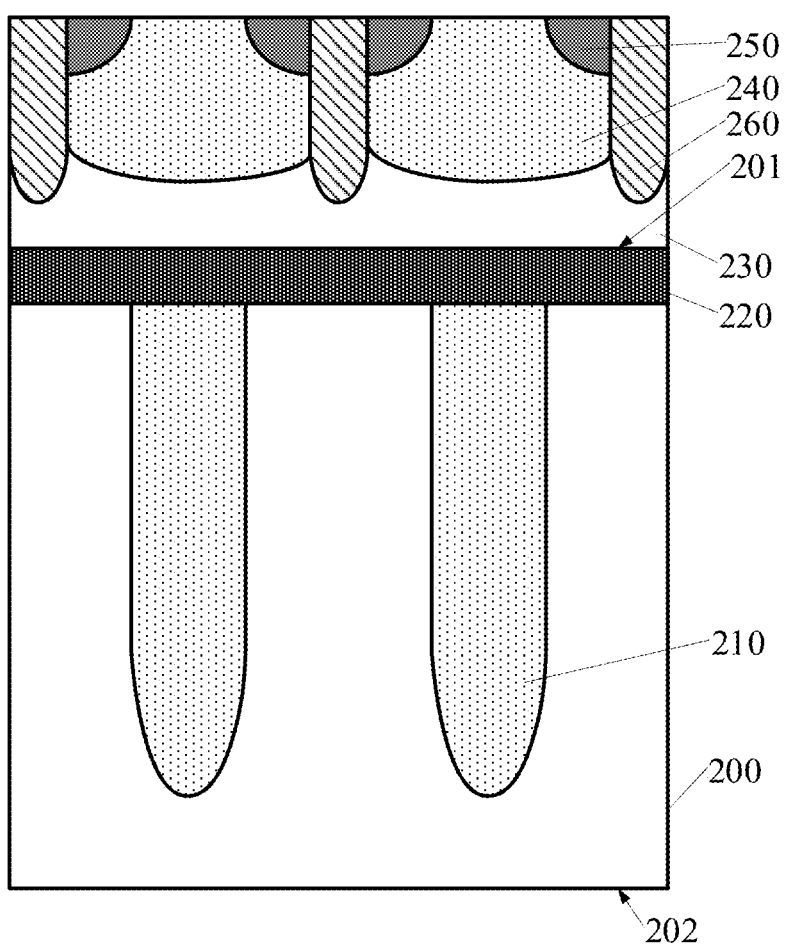

Referring to FIG. 6, a body region 240, a source region 250 and a gate structure 260 are formed in the first epitaxial layer 230.

In some embodiments, the body region 240 is disposed above the barrier doped region 220, and at least a portion of the body region 240 is also disposed above the deep trench structure 210.

In some embodiments, the body region 240 is doped with P-type ions.

In some embodiments, the source region 250 is disposed in the body region 240, and a partial surface of the source region 250 is exposed by the body region 240.

In some embodiments, the source region 250 is doped with N-type ions.

In some embodiments, the gate structure 260 is disposed above the barrier doped region 220, the gate structure 260 is also disposed above the substrate 200 adjacent to the deep trench structure 210, and the gate structure 260 is in contact with the body region 240 and the partial surface of the source region 250 exposed by the body region 240.

In some embodiments, the gate structure 260 includes a gate electrode (not shown) and a gate dielectric layer (not shown) disposed between the gate electrode and the first epitaxial layer 230, and the gate dielectric layer is also disposed between the gate electrode and surfaces of the body region and the source region.

Specifically, the body region 240, the source region 250, and the gate structure 260 are spaced from the barrier doped region 220 by the first epitaxial layer 230, and surfaces of the gate structure 260, the body region 240 and the source region 250 are exposed by the surface of the first epitaxial layer 230.

In some embodiments, the method of forming the gate structure 260 in the first epitaxial layer 230 includes: forming a second mask layer (not shown) on the surface of the first epitaxial layer 230, wherein a part of the surface of the first epitaxial layer 230 on the substrate 200 on at least one side of the deep trench structure 210 is exposed by the second mask layer; etching the first epitaxial layer 230 with the second mask layer as a mask to form a gate opening (not shown) in the first epitaxial layer 230; forming a gate dielectric layer on an inner wall surface of the gate opening; forming a gate electrode in the gate opening to form the gate structure 260 after forming the gate dielectric layer; and removing the second mask layer after forming the gate structure 260.

In some embodiments, the method of forming the body region 240 and the source region 250 in the first epitaxial layer 230 includes: performing ion implantation on the first epitaxial layer 230 disposed above the deep trench structure 210 at one side of the gate structure 260 to form the body region 240 in the first epitaxial layer 230, and performing ion implantation on a portion of the body region 240 to form the source region 250 in the body region 240.

In some embodiments, the body region and the source region may also be formed prior to the gate structure.

Figure 7:
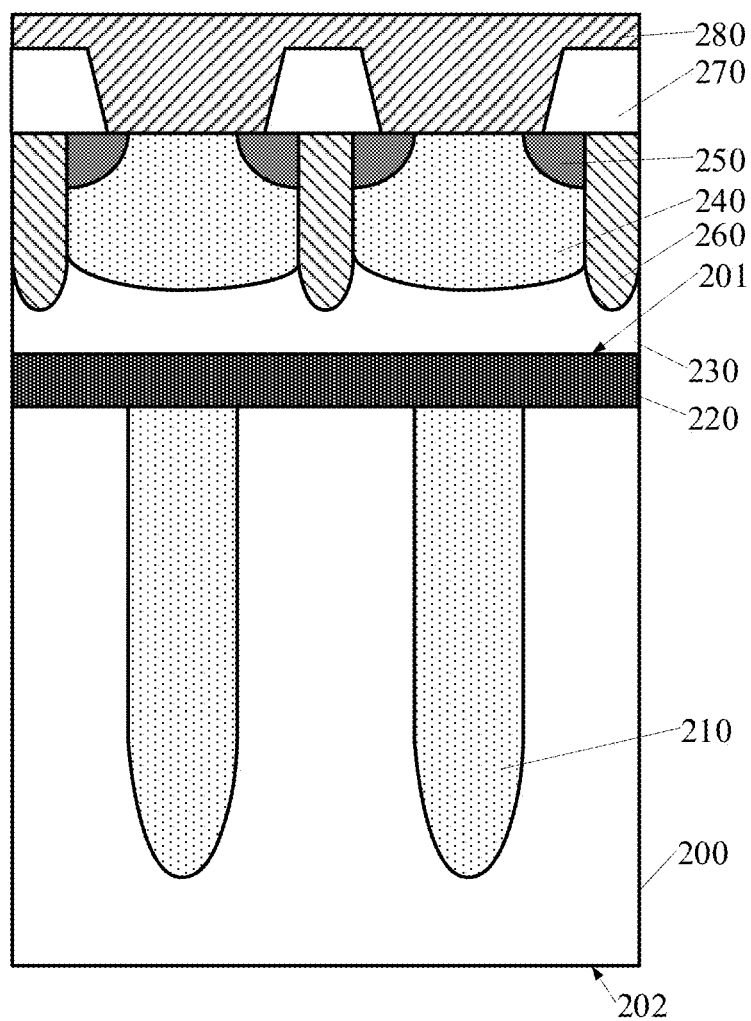

Referring to FIG. 7, an interlayer dielectric layer 270 is formed on the surface of the first epitaxial layer 230 and on the exposed surfaces of the gate structure 260, the body region 240 and the source region 250.

The interlayer dielectric layer 270 is made of a material including a dielectric material.

In some embodiments, the process of forming the interlayer dielectric layer 270 includes a chemical vapor deposition process or the like.

Still referring to FIG. 7, a first conductive structure (not shown) is formed in the interlayer dielectric layer 270 and coupled to the gate structure 260, and a second conductive structure 280 is formed in the interlayer dielectric layer 270 and coupled to the body region 240 and the source region 250.

The first conductive structure is used to lead out the gate structure 260 (the gate of the IGBT device).

The second conductive structure is used to lead out the body region 240 and the source region 250 (the emitter of the IGBT device).

In some embodiments, the method of forming the first conductive structure and the second conductive structure 280 in the interlayer dielectric layer 270 includes: forming a third mask layer (not shown) on a surface of the interlayer dielectric layer 270, wherein a part of the surface of the interlayer dielectric layer 270 is exposed by the third mask layer; etching the interlayer dielectric layer 270 with the third mask layer as a mask to form a first opening (not shown) and a second opening (not shown), wherein a part of a top surface of the gate structure 260 is exposed by the first opening, and a part of top surfaces of the source region 250 and the body region 240 is exposed by the second opening; and filling the first opening and the second opening with a conductive material to form the first conductive structure and the second conductive structure 280.

In other embodiments, the first epitaxial layer may be patterned according to different mask layers to form the first opening and the second opening, respectively.

Figure 8:
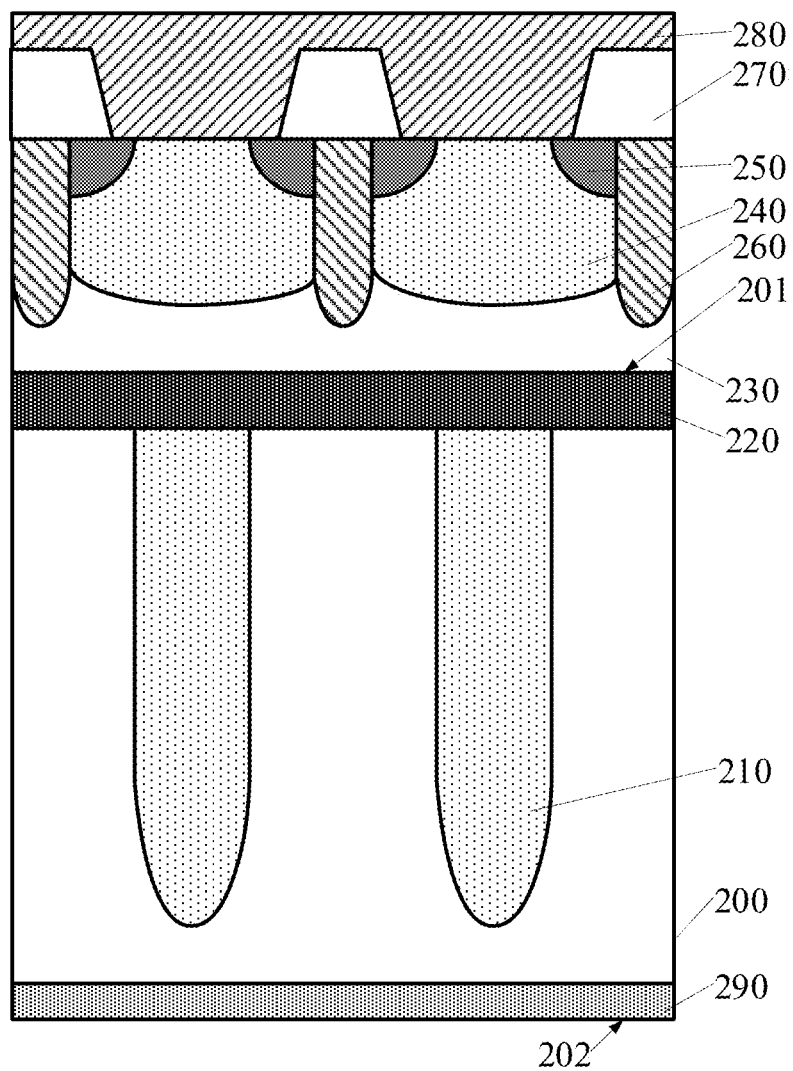

Next, referring to FIG. 8, a collector region 290 is formed at the bottom of the substrate 200, and a surface of the collector region 290 is exposed by the second surface 202. The collector region 290 is spaced from a bottom of the deep trench structure 210 by the substrate 200.

The collector region 290 is doped with a fifth ion.

In some embodiments, the fifth ion is a P-type ion and the doping concentration of the fifth ion is greater than the doping concentration of the second ion.

In some embodiments, the substrate 200 is thinned from the second surface 202 using a back thinning process before forming the collector region 290.

In some embodiments, the method of forming the collector region 290 includes performing an ion implantation process on the second surface 202 to form the collector region 290 at the bottom of the substrate 200 after thinning the substrate 200.

In some embodiments, after forming the collector region 290, a bottom interlayer dielectric layer (not shown) is formed on the second surface 202 and exposed surface of the collector region 290, and a third conductive structure (not shown) is formed in the bottom interlayer dielectric layer and is coupled to the collector region 290 to lead out the collector region 290 (the collector of the IGBT device).

Accordingly, another embodiment of the present disclosure provides a semiconductor structure formed by the above-mentioned method. Still referring to FIG. 8, the semiconductor structure includes the substrate 200, the deep trench structure 210, the barrier doped region 220, the first epitaxial layer 230, the body region 240, the source region 250, the gate structure 260, and the collector region 290. The substrate 200 is doped with the first ion, and has the first surface 201 and the second surface 202 opposite to each other. The deep trench structure 210 is disposed in the substrate 200, and the top surface of the deep trench structure 210 is exposed by the first surface 201. The deep trench structure 210 is doped with the second ion, and the conductivity type of the second ion is opposite to that of the first ion. The barrier doped region 220 is disposed at the top of the substrate 200 and the deep trench structure 210, and the barrier doped region 220 is doped with the third ion. The conductivity type of the third ion is the same as that of the first ion, and the doping concentration of the third ion is greater than that of the first ion. The first epitaxial layer 230 is disposed on the barrier doped region 220, and the first epitaxial layer 230 is doped with the fourth ion. The conductivity type of the fourth ion is the same as that of the third ion, and the doping concentration of the third ion is greater than that of the fourth ion. The body region 240 is disposed in the first epitaxial layer 230. The body region 240 is disposed above the barrier doped region 220, and at least part of the body region 240 is also disposed above the deep trench structure 210. The source region 250 is disposed in the body region 240, and a part of the surface of the source region 250 is exposed by the body region 240. The gate structure 260 is disposed in the first epitaxial layer 230, and the gate structure 260 is disposed above than the barrier doped region 220. The gate structure 260 is also disposed above the substrate 200 adjacent to the deep trench structure 210, and the gate structure 260 is in contact with the body region 240 and the exposed partial surface of the source region 250. The collector region 290 is disposed at the bottom of the substrate 200. A surface of the collector region 290 is exposed by the second surface 202, and the collector region 290 is spaced from the bottom of the deep trench structure 210 by the substrate 200.

Since the conductivity types of the second ion and the first ion are opposite, a super junction structure is formed between the deep trench structure 210 and the substrate 200 around the deep trench structure 210, so that an insulated gate bipolar transistor (hereinafter referred to as an IGBT device) formed by the substrate 200 and the deep trench structure 210 can have a higher withstand voltage performance when being turned off.

On the one hand, the barrier doped region 220 is disposed on the top of the substrate 200 and the deep trench structure 210, the first epitaxial layer 230 is disposed on the barrier doped region 220, the body region 240 and the gate structure 260 are disposed in the first epitaxial layer 230, the source region 250 is disposed in the body region 240, and both the body region 240 and the gate structure 260 are disposed above the barrier doped region 220 (namely, the barrier doped region 220 is spaced apart from the body region 240, the source region 250 and the gate structure 260 by a part of the first epitaxial layer 230), on the other hand, the doping concentration of the third ion is greater than that of the fourth ion and the first ion. Therefore, carriers (holes) entering the body region 240 through the deep trench structure 210 (injected from the collector region 290) can be blocked by the barrier doped region 220 at a certain distance from the body region 240, thus the carriers (holes) entering the body region 240 are reduced. Therefore, the carriers (holes) injected from the collector region 290 can be better collected in a drift region below the body region 240 and the gate structure 260 (i.e., the first epitaxial layer 230, the barrier doped region 220 and the substrate 200 below the body region 240 and the gate structure 260), and the concentration of the carriers (holes) of the drift region can be increased. Thus, not only an on-resistance of the drift region can be reduced to reduce an on-state voltage drop of the insulated gate bipolar transistor, but also a turn-off energy loss (EOFF) of the insulated gate bipolar transistor can be improved. Furthermore, the performance of the IGBT device can be improved.

In some practical applications, compared with the insulated gate bipolar transistor shown in FIG. 1, Figure Of Merit (FOM, FOM=Vcesat×Eoff) of the IGBT device can be increased by 5% through the barrier doped region 220.

In some embodiments, the material of the substrate 200 includes semiconductor material. Specifically, the material of the substrate 200 includes silicon.

In some embodiments, the material of the substrate includes silicon carbide, silicon germanium, multicomponent semiconductor material composed of III-V elements, Silicon On Insulator (SOI) or Germanium On Insulator (GOI), etc. The multicomponent semiconductor material composed of III-V elements includes InP, GaAs, GaP, InAs, InSb, InGaAs or InGaAsP, etc.

In some embodiments, the first ion is an N-type ion, that is, the substrate 200 is an N-type substrate.

Specifically, the N-type ion includes phosphorous ion or arsenic ion.

In some embodiments, the first ion may also be a P-type ion to form a device structure having a conductivity type diametrically opposite to that of above embodiments.

In some embodiments, a doping concentration of the first ion doped in the substrate 200 ranges from 1E15 atoms per cubic centimeter to 1E18 atoms per cubic centimeter.

In some embodiments, the second ion is a P-type ion.

Specifically, the P-type ion includes boron ion or indium ion.

In some embodiments, the third ion is an N-type ion. Accordingly, the carriers blocked by the barrier doped region 220 are holes injected from the collector region.

Specifically, the third ion is a phosphorus ion.

In some embodiments, the doping concentration of the third ion in the barrier doped region 220 ranges from 1E15 atoms per cubic centimeter to 1E18 atoms per cubic centimeter.

If the doping concentration of the third ion in the barrier doped region 220 is too low, blocking ability for carriers will be weak, and thus better blocking for carriers cannot be achieved. Therefore, with an appropriate doping concentration, that is, the doping concentration of the third ion in the barrier doped region 220 is between 1E15 atoms per cubic centimeter and 1E18 atoms per cubic centimeter, the barrier doped region 220 can have better blocking ability for carriers entering the body region 250, so as to better improve the performance of the IGBT device.

In some embodiments, in the direction perpendicular to the first surface 201, the depth of the barrier doped region 220 ranges from 0.1 micron to 10 microns.

If the depth of the barrier doped region 220 is too small, blocking capability for carriers is weak, and thus better blocking for carriers cannot be achieved. If the depth of the barrier doped region 220 is too large, on the one hand, the efficiency of the manufacturing process may be reduced, on the other hand, the super junction structure may be affected, which adversely affects the withstand voltage performance of the IGBT device. Therefore, with a suitable depth range of the barrier doped region 220, a better voltage withstand performance of the IGBT device can be achieved, while having a better blocking capability for the carriers. Also, the efficiency of the manufacturing process can be increased.

In some embodiments, the fourth ion is an N-type ion.

In some embodiments, the doping concentration of the fourth ion in the first epitaxial layer 230 is greater than the doping concentration of the first ion in the substrate 200.

Since the conductivity types of the fourth ion and the third ion are the same, and the subsequently formed body region and the deep trench structure 220 are spaced apart by a part of the first epitaxial layer 230, the blocking ability for carriers entering the body region can be further increased by making the doping concentration of the fourth ion in the first epitaxial layer 230 greater than the doping concentration of the first ion in the substrate 200 based on the first epitaxial layer 230 on the basis of the barrier doped region 220.

In some embodiments, the doping concentration of the fourth ion in the first epitaxial layer is in the range of 1E15 atoms per cubic centimeter to 1E18 atoms per cubic centimeter.

In some embodiments, the body region 240 is doped with P-type ions.

In some embodiments, the source region 250 is doped with N-type ions.

In some embodiments, the gate structure 260 includes a gate electrode (not shown) and a gate dielectric layer (not shown) disposed between the gate electrode and the first epitaxial layer 230, and the gate dielectric layer is also disposed between the gate electrode and surfaces of the body region and the source region.

Specifically, the body region 240, the source region 250, and the gate structure 260 are spaced from the barrier doped region 220 by the first epitaxial layer 230, and surfaces of the gate structure 260, the body region 240 and the source region 250 are exposed by the surface of the first epitaxial layer 230.

In some embodiments, the semiconductor structure further includes an interlayer dielectric layer 270, a first conductive structure and a second conductive structure 280. The interlayer dielectric layer 270 is disposed on the surface of the first epitaxial layer 230 and on the exposed surfaces of the gate electrode structure 260, the body region 240 and the source region 250. The first conductive structure (not shown) is disposed in the interlayer dielectric layer 270, and is coupled to the gate electrode structure 260. The second conductive structure 280 is disposed in the interlayer dielectric layer 270 and is coupled to the body region 240 and the source region 250.

The interlayer dielectric layer 270 is made of a material including a dielectric material.

The first conductive structure is used to lead out the gate structure 260 (the gate of the IGBT device).

The second conductive structure is used to lead out the body region 240 and the source region 250 (the emitter of the IGBT device).

In some embodiments, the collector region 290 is doped with a fifth ion.

In some embodiments, the fifth ion is a P-type ion and the doping concentration of the fifth ion is greater than the doping concentration of the second ion.

In some embodiments, the semiconductor structure further includes a bottom interlayer dielectric layer (not shown) disposed on the second surface 202 and on the exposed surface of the collector region 290, and a third conductive structure (not shown) disposed in the bottom interlayer dielectric layer. The third conductive structure is coupled to the collector region 290 to lead out the collector region 290 (the collector of an IGBT device).

Although the present disclosure has been described above, the present disclosure is not limited thereto. Any person skilled in the art can make various changes and modifications without departing from the spirit and scope of the present disclosure. Therefore, the protection scope of the present disclosure shall be determined by the claims.

The invention claimed is:

1. A semiconductor structure, comprising:
a substrate doped with a first ion, wherein the substrate has a first surface and a second surface opposite to each other;
a deep trench structure disposed in the substrate, wherein the first surface exposes a top surface of the deep trench structure, and the deep trench structure is doped with a second ion having a conductivity type opposite to a conductivity type of the first ion;
a barrier doped region disposed on a top of the substrate and the deep trench structure, wherein the barrier doped region is doped with a third ion having a conductivity type same as the conductivity type of the first ion, and a doping concentration of the third ion is greater than a doping concentration of the first ion;
a first epitaxial layer disposed on the barrier doped region, wherein the first epitaxial layer is doped with a fourth ion having a conductivity type same as the conductivity type of the third ion, and the doping concentration of the third ion is greater than a doping concentration of the fourth ion;

a body region disposed in the first epitaxial layer, wherein the body region is disposed above the barrier doped region, and at least a part of the body region is disposed above the deep trench structure;

a source region disposed in the body region, wherein the body region exposes a partial surface of the source region;

a gate structure disposed in the first epitaxial layer, wherein the gate structure is disposed above the barrier doped region, the gate structure is also disposed above the substrate adjacent to the deep trench structure, and the gate structure is in contact with the body region and the exposed partial surface of the source region; and a collector region disposed at a bottom of the substrate, wherein the second surface exposes a surface of the collector region, and the collector region is spaced from a bottom of the deep trench structure by the substrate;

wherein the barrier doped region is spaced apart from the body region, the source region and the gate structure by a part of the first epitaxial layer;

wherein the barrier doped region is configured to block carriers entering the body region through the deep trench structure at a certain distance from the body region so as to reduce the carriers entering the body region;

wherein the certain distance is equal to a thickness of the part of the first epitaxial layer.

2. The semiconductor structure according to claim 1, wherein the barrier doped region has a depth ranging from 0.1 micron to 10 microns in a direction perpendicular to the first surface.

3. The semiconductor structure according to claim 1, wherein the first ion, the third ion and the fourth ion are N-type and the second ion is P-type.

4. The semiconductor structure according to claim 3, wherein the third ion is phosphorus ion, and the doping concentration of the third ion doped in the barrier doped region ranges from 1E15 atoms per cubic centimeter to 1E18 atoms per cubic centimeter.

5. The semiconductor structure according to claim 3, wherein the collector region is doped with a fifth ion, the fifth ion is P-type and a doping concentration of the fifth ion is greater than a doping concentration of the second ion.

6. The semiconductor structure according to claim 1, wherein the doping concentration of the fourth ion is greater than the doping concentration of the first ion.

7. The semiconductor structure according to claim 6, wherein the doping concentration of the fourth ion doped in the first epitaxial layer ranges from 1E15 atoms per cubic centimeter to 1E18 atoms per cubic centimeter.

8. The semiconductor structure according to claim 6, wherein the doping concentration of the first ion doped in the substrate ranges from 1E15 atoms per cubic centimeter to 1E18 atoms per cubic centimeter.

9. The semiconductor structure according to claim 1, wherein the body region is doped with a P-type ion and the source region is doped with a N-type ion.

10. The semiconductor structure according to claim 1, wherein the gate structure comprises a gate electrode and a gate dielectric layer disposed between the gate electrode and the first epitaxial layer, and the gate dielectric layer is also disposed between the gate electrode and surfaces of the body region and the source region.

11. The semiconductor structure according to claim 1, wherein a surface of the first epitaxial layer exposes surfaces of the gate structure, the body region and the source region, and the semiconductor structure further comprises: an interlayer dielectric layer disposed on the surface of the first epitaxial layer and exposed surfaces of the gate structure, the body region and the source region, a first conductive structure disposed in the interlayer dielectric layer and coupled to the gate structure, and a second conductive structure disposed in the interlayer dielectric layer and coupled to the body region and the source region.

12. The semiconductor structure according to claim 1, further comprising: a third conductive structure electrically coupled to the collector region.

13. A method of forming a semiconductor structure, comprising:

providing a substrate doped with a first ion, wherein the substrate has a first surface and a second surface opposite to each other;

forming a deep trench structure in the substrate, wherein the first surface exposes a top surface of the deep trench structure, and the deep trench structure is doped with a second ion having a conductivity type opposite to a conductivity type of the first ion;

forming a barrier doped region on a top of the substrate and the deep trench structure, wherein the barrier doped region is doped with a third ion having a conductivity type same as the conductivity type of the first ion, and a doping concentration of the third ion is greater than a doping concentration of the first ion;

forming a first epitaxial layer on the barrier doped region, wherein the first epitaxial layer is doped with a fourth ion having a conductivity type same as the conductivity type of the third ion, and the doping concentration of the third ion is greater than a doping concentration of the fourth ion;

forming a body region, a source region and a gate structure in the first epitaxial layer, wherein the body region is disposed above the barrier doped region, and at least part of the body region is disposed above the deep trench structure, wherein the body region exposes a partial surface of the source region, and wherein the gate structure is disposed above the barrier doped region, the gate structure is also disposed above the substrate adjacent to the deep trench structure, and the gate structure is in contact with the body region and the exposed partial surface of the source region; and forming a collector region at a bottom of the substrate after forming the body region, source region and gate structure, wherein the second surface exposes a surface of the collector region, and the collector region is spaced from a bottom of the deep trench structure by the substrate;

wherein the barrier doped region is spaced apart from the body region, the source region and the gate structure by a part of the first epitaxial layer;

wherein the barrier doped region is configured to block carriers entering the body region through the deep trench structure at a certain distance from the body region so as to reduce the carriers entering the body region;

wherein the certain distance is equal to a thickness of the part of the first epitaxial layer.

14. The method according to claim 13, wherein the first ion, the third ion and the fourth ion are N-type and the second ion is P-type.

15. The method according to claim 13, wherein forming the barrier doped region on the top of the substrate and the deep trench structure comprises:

performing ion implantation on the first surface and the top surface of the deep trench structure.

16. The method according to claim 15, wherein process parameters for performing ion implantation on the first surface and the top surface of the deep trench structure are as follows: implanted ion comprises phosphorus ion, implantation dose ranges from 1E11 atoms per square centimeter to 1E14 atoms per square centimeter, and implantation energy ranges from 1 MeV to 3 MeV.

17. The method according to claim 13, wherein forming the deep trench structure in the substrate comprises: etching the substrate to form a deep trench in the substrate, wherein the first surface exposes the deep trench; and forming the deep trench structure in the deep trench by an epitaxial growth process.

* * * * *